United States Patent [19]

Sato et al.

[11] Patent Number: 4,896,302

[45] Date of Patent: Jan. 23, 1990

[54] SEMICONDUCTOR MEMORY DEVICE HAVING COMMON DRIVER CIRCUITS FOR PLURAL MEMORY CELL ARRAYS

[75] Inventors: Kimiaki Sato; Yoshihiro Takemae, both of Tokyo; Masao Nakano; Nobumi Kodama, both of Kawasaki, all of Japan

[73] Assignee: Fujitsu Limited, Kawasaki, Japan

[21] Appl. No.: 277,392

[22] Filed: Nov. 22, 1988

Related U.S. Application Data

[63] Continuation of Ser. No. 844,377, Mar. 26, 1986, abandoned.

[30] Foreign Application Priority Data

Mar. 30, 1985 [JP] Japan .................................. 60-68247

[51] Int. Cl.[4] .......................... G11C 5/02; G11C 7/00; G11C 8/00; H03K 19/094
[52] U.S. Cl. ........................... 365/230.06; 365/230.03; 365/189.08; 365/51; 365/220; 307/449; 307/463
[58] Field of Search .................. 365/51, 182, 189, 230, 365/230.30, 230.05, 230.06, 220, 189.03, 189.08; 307/449, 463

[56] References Cited

U.S. PATENT DOCUMENTS

| | | | |
|---|---|---|---|
| 4,264,828 | 4/1981 | Perlegos et al. | 307/463 |
| 4,590,588 | 5/1986 | Itoh et al. | 365/51 |
| 4,608,672 | 8/1986 | Roberts et al. | 365/230 |
| 4,611,131 | 9/1986 | Shah | 365/230 |
| 4,612,631 | 9/1986 | Ochii | 365/230 |
| 4,660,174 | 4/1987 | Takemae et al. | 365/51 |
| 4,675,845 | 6/1987 | Itoh et al. | 365/51 |
| 4,700,328 | 10/1987 | Burghard | 365/51 |
| 4,724,531 | 2/1988 | Angleton et al. | 365/230 |

FOREIGN PATENT DOCUMENTS

| | | |
|---|---|---|
| 0045063 | 3/1982 | European Pat. Off. |
| 5486239 | 7/1979 | Japan . |
| 2078405 | 1/1982 | United Kingdom . |

Primary Examiner—Stuart N. Hecker
Assistant Examiner—Melissa J. Koval
Attorney, Agent, or Firm—Staas & Halsey

[57] ABSTRACT

In a semiconductor memory device, a decoder circuit is located between first and second memory cell arrays. A sequence of driver circuits in the decoder circuit is provided as driver circuits common to the first and second memory cell arrays. The output terminal of the driver circuit is connected directly with a data input-/output portion for the first memory cell array and connected with another data input/output portion for the second memory cell array through wirings traversing the decoder circuit.

4 Claims, 4 Drawing Sheets

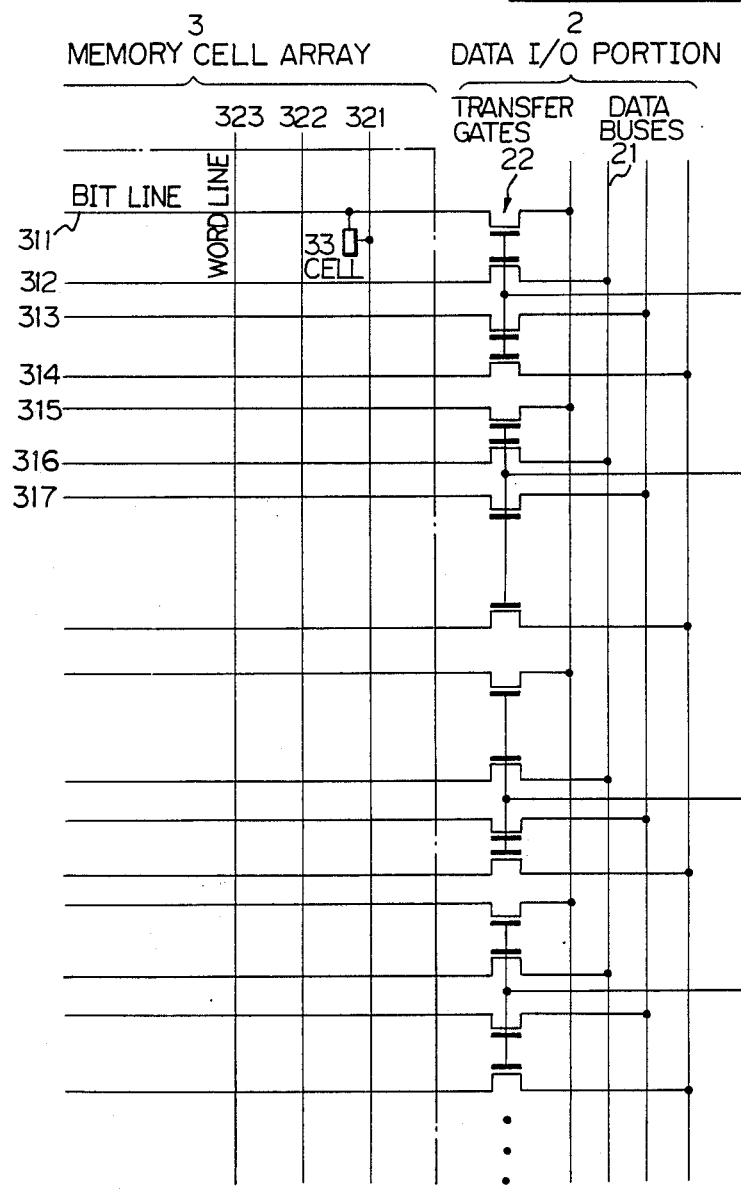

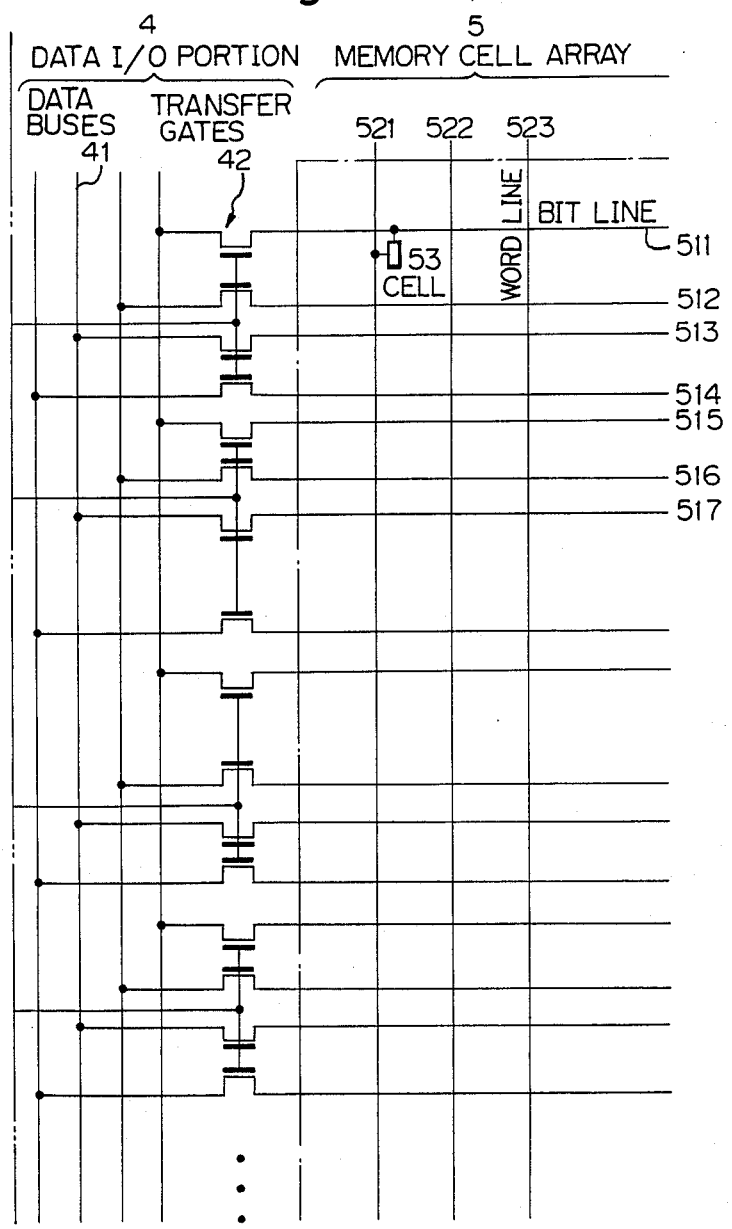

SEMICONDUCTOR MEMORY DEVICE HAVING COMMON DRIVER CIRCUITS FOR PLURAL MEMORY CELL ARRAYS

This is a continuation of co-pending application Ser. No. 844,377 now abandoned filed Mar. 26, 1986.

BACKGROUND OF THE INVENTION

1. Field of the Invention

The present invention relates to a semiconductor memory device having plural memory cell array portions and a column decoder portion between these memory cell array portions. The semiconductor memory device according to the present invention is used, for example, as a dynamic random access memory (DRAM).

2. Description of the Related Art

Recently, an arrangement of the semiconductor memory device such as a DRAM has been used in which a decoder portion is located at the central part of the semiconductor memory device between a plurality of memory cell array portions. Such an arrangement is desirable to reduce differences in the transmission time from the decoder to a memory cell relatively close to the decoder and to a memory cell relatively far from the decoder.

In the above-described arrangement, since the distance between the adjacent bit lines has been reduced because of the reduction of pitch of a memory cell due to the highly integrated, highly concentrated structure of a semiconductor memory device, the width of a driver circuit in a column decoder along the direction perpendicular to the bit lines is required to be reduced. Such reduction of the width of the driver circuit causes an increase in the width of the driver circuit along the direction of the bit lines, and hence a considerable increase in the area of the column decoder.

This situation causes difficulty in further increasing the capacity of a semiconductor memory device.

SUMMARY OF THE INVENTION

It is an object of the present invention to provide an improved semiconductor memory device in which the entire area of the decoder portion is reduced so that the capacity as well as the degree of integration of a semiconductor memory device can be increased.

According to the present invention, there is provided a semiconductor memory device having a first memory cell array and a first data input/output portion, a second memory cell array and a second data input/output portion, and a decoder circuit between the first and second data input/output portions. The decoder circuit includes address lines, a sequence of logic gate circuits for receiving address signals and producing selection signals, and a sequence of driver circuits corresponding to the sequence of logic gate circuits for receiving the selection signals and producing drive signals. The sequence of driver circuits is provided in such a way that the driver circuits are common to the first and second memory cell arrays. The output terminal of the driver circuit is connected directly with the first data input/output portion and is connected with the second data input/output portion through wirings traversing the decoder circuit.

DESCRIPTION OF THE PREFERRED EMBODIMENTS

Figure 1B:
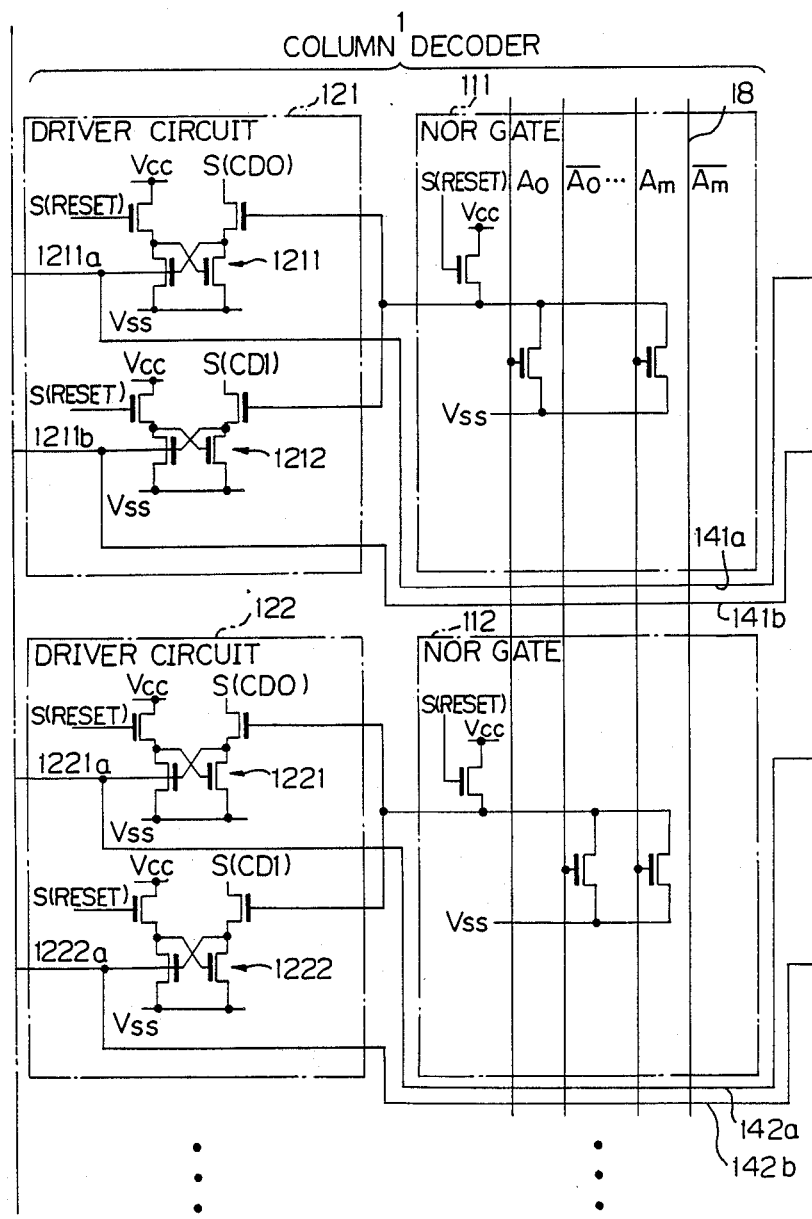
FIG. 1 depicts the relationship of FIGS. 1A, 1B and 1C which are a schematic diagram of the semiconductor memory device according to an embodiment of the present invention.
Figure 2:
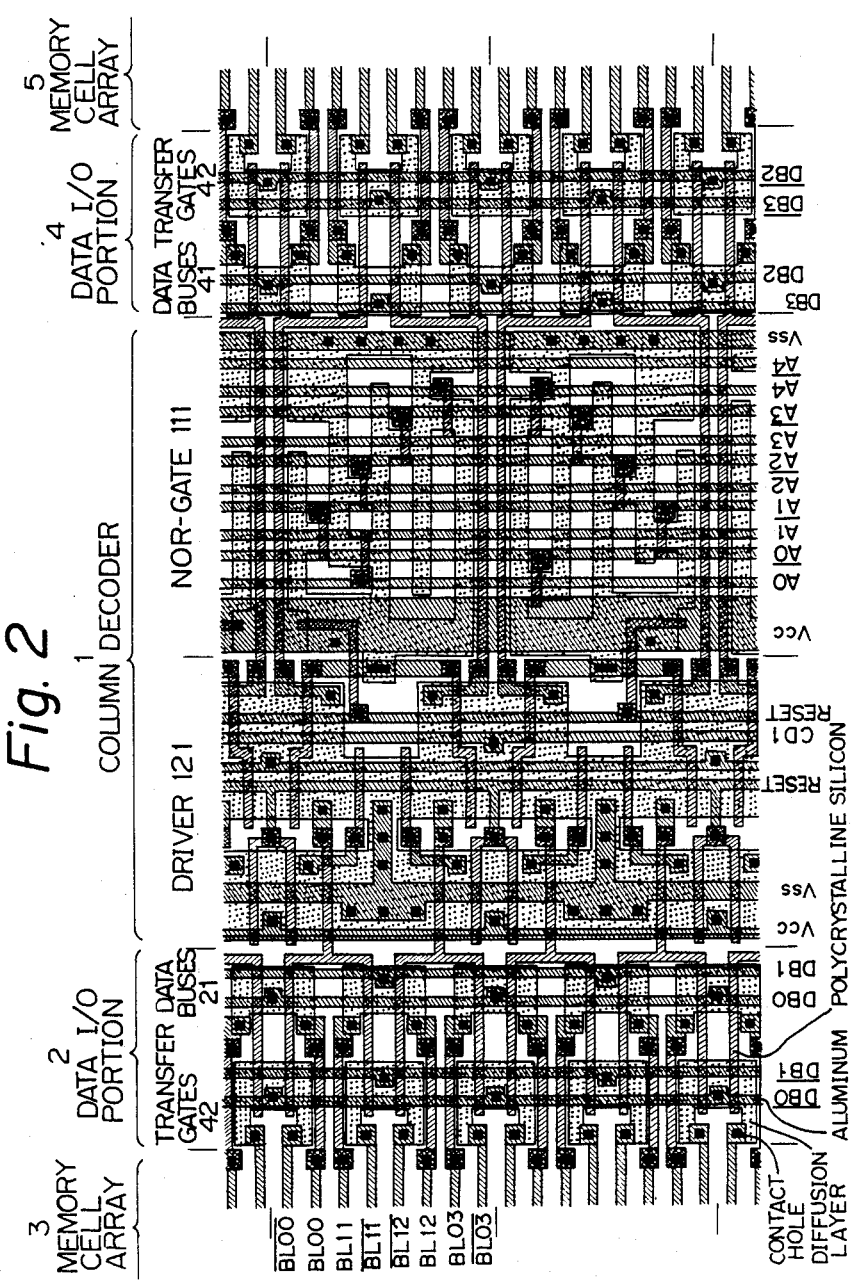
FIG. 2 is an example of the arrangement of the pattern of the device shown in FIG. 1.

A semiconductor memory device according to an embodiment of the present invention is shown in FIG. 1. An example of the arrangement of the pattern of the device of FIG. 1 is shown in FIG. 2.

The device of FIG. 1 includes a left-side memory cell array 3, a left-side data input/output portion 2 having a plurality of transfer gates 22 and a plurality of data buses 21, a column decoder 1 having plurality of drivers 121 and a plurality of NOR gates 111, a right-side data input/output portion 4 having a plurality of data buses 41 and a plurality of transfer gates 42, and a right-side memory cell array 5.

Bit lines 311, 312, 313, ..., word lines 321, 322, 323, ..., and memory cells (represented by 33) are provided in the memory cell array 3. Bit lines 511, 512, 513, ..., word lines 521, 522, 523, ..., and memory cells (represented by 53) are provided in the memory cell array 5.

The column decoder 1 includes a plurality of address lines 18, a sequence of NOR gate circuits 111, 112, ..., and a sequence of driver circuits 121, 122, ... The driver circuits 121, 122, ... correspond to the NOR gate circuits 111, 112, ...

In the device of FIG. 1, the sequence of driver circuits 121, 122, ... is provided in such a way that the driver circuits are common to the left-side memory cell array 3 and the right-side memory cell array 5.

In the device of FIG. 1, the output terminal of the driver is connected with the one side data input/output portion directly, and is connected with the other side data input/output portion through wirings traversing the decoder circuit. As illustrated in FIG. 1, the output terminals 1211a, 1211b, 1221a, and 1222a are connected directly with the corresponding gates of the transfer gates 22, and are connected with the corresponding gates of the transfer gates 42 through wirings 141a, 141b, 142a, and 142b. The wirings 141a, 141b, 142a, and 142b are cross-under wirings formed by the diffusion layers or the impurity doped regions having predetermined equivalent resistances.

The driver circuit 121 consists of two flip-flop circuits 1211 and 1212. The output signal of the NOR gate 111 is supplied to the input terminals of the flip-flop circuits 1211 and 1212. The output signals of the flip-flop circuits 1211 and 1212 are supplied to the corresponding gates of the transfer gates 22 in the data input/output portion 2. In the flip-flop circuit 1211, the left-side series connection of transistors is connected between $V_{CC}$ and $V_{SS}$, and the right-side series connection of transistors is connected between a clock signal source S(CD0) and $V_{SS}$. In the flip-flop circuit 1212, the left-side series connection of transistors is connected between $V_{CC}$ and $V_{SS}$, and the right-side series connection of transistors is connected between a clock signal source S(CD1) and $V_{SS}$. The gates of the VCC-side transistors of the left-side series connections of transistors in the flip-flop circuits 1211 and 1212 are supplied with the reset signal S(RESET).

The read operation of the device of FIG. 1 is carried out as follows. A desired word line is selected by a row-side address, and the data stored in the memory cells corresponding to the selected desired word line is delivered to the bit lines 311, 312, 313 ... A columnside address is supplied to the address lines 18, and the potential of the output of one of the NOR gates 111, 112, ... becomes HIGH, leaving the potentials of the output of the other NOR gates at LOW.

The clock signals S(CD0) and S(CD1) are pre-decoded by one of the column address signals, and the potential of one of S(CD0) and S(CD1) is LOW, while the other is HIGH. Hence, the potential of the input signal of the flip-flop circuits 1211 and 1212 of the driver circuit 121 corresponding to the selected NOR gate 111 becomes HIGH. If the potential of the signal S(CD0) is HIGH and the potential of the signal S(CD1) is LOW, the potential of the output signal of the flip-flop circuit 1211 becomes HIGH, while that of the flip-flop circuit 1212 becomes LOW. Hence, the transfer gates for the bit lines connected with the flip-flop circuit 1211 become ON, so that the data of the bit lines is delivered to the data buses 21 through the transfer gates in the ON state.

The output signals of the driver circuit 121 are also supplied to the right-side memory cell array 5 through the wiring 141a and 141b. Hence, the data of the memory cells corresponding to the selected columns and corresponding to the selected word lines is read.

In the device of FIG. 1, the selection from the flip-flop circuits 1211 and 1212 are carried out by the clock signals S(CD0) and S(CD1) as the decoder driving signals produced by the pre-decoding of one of the address signals. On the basis of such selection, one of the NOR gates is selected by the signal of the address lines 18. Thus, one bit of the address is decoded externally. Due to such external decoding, only one NOR gate and only one driver circuit per two columns are required to be inserted between the left-side and right-side memory cell arrays 3 and 5. Hence, the number of the NOR gates and the driver circuits can be reduced, and the area of the column decoder can be reduced.

An example of the arrangement of the pattern of the device of FIG. 1 is shown in FIG. 2. In FIG. 2, the memory cell array 3, the data input/output portion 2, the driver circuits 121, 122, the NOR gates 111, 112, the data input/output portion 4, and the memory cell array 5 are arranged from left to right. $\overline{BL00}$ (barred BL00), BL00, BL11, $\overline{BL11}$, $\overline{BL12}$, BL12, BL03, and $\overline{BL03}$ represent the bit lines, $\overline{DB0}$, $\overline{DB1}$, DB0, and DB1 represent the data buses, $V_{CC}$ and $V_{SS}$ represent power source lines, RESET represents the reset signal line, CD0 and CD1 represent the clock signal lines, $A_0$, $\overline{A_0}$, $A_1$, $\overline{A_1}$, $A_2$, $\overline{A_2}$, $A_3$, $\overline{A_3}$, $A_4$, and $\overline{A_4}$ represent the address lines, and DB3, DB2, $\overline{DB3}$, and $\overline{DB2}$ represent the data buses.

In the arrangement shown in FIG. 1, all of the driver circuits 121, 122, ... are located at the same side of the sequence of the NOR gates 111, 112, ... However, instead of the arrangement shown in FIG. 1, it is possible to locate the driver circuits 121, 122, ... alternatively at both sides of the sequence of NOR gates 111, 112, ..., that is, the driver circuits 121, 123, 125, ... are located at the left side and the driver circuits 122, 124, 126, ... are located at the right side of the sequence of the NOR gates 111, 112, ..., as a modified arrangement In this modified arrangement, two sets of lines for supplying the clock signals S(CD0) and S(CD1) are necessary, but the width of the driver circuit 121, 122, ... along the horizontal direction can be reduced.

We claim:
1. A semiconductor memory device, comprising:
a first memory cell array and a first data input/output portion having transfer gates and data buses;
a second memory cell array and a second data input/output portion having transfer gates and data buses;
wirings connecting a sequence of driver circuits to said second data input/output portion; and
a column decoder circuit disposed between said first and second data input/output portions, said wirings traversing said column decoder circuit, said column decoder circuit, comprising:
address lines having address signals thereon;
a sequence of logic gate circuits, coupled to said address lines and said second data input/output portion of said second memory cell array, for receiving address signals and producing selection signals; and
said sequence of driver circuits, respectively coupled between and disposed in parallel with said sequence of logic gate circuits and the first data input/output portion of said first memory cell array, for receiving the selection signals and producing drive signals, said sequence of driver circuits being provided as driver circuits common to said first and second memory cell arrays, each of said driver circuits having an output terminal directly connected to said first data input/output portion and connected to said second data input/output portion through said wirings traversing said sequence of said logic gate circuits.

2. A device according to claim 1, wherein said column decoder circuit is located at a central portion of said semiconductor memory device, and wherein said first memory cell array and said second memory cell array are located to the left and right, respectively, of said column decoder circuit.

3. A device according to claim 1, wherein each of said driver circuits is located adjacent to each of said logic gate circuits.

4. A device according to claim 1, wherein said sequence of driver circuits is located adjacent to said sequence of logic gate circuits.

* * * * *